United States Patent
Taub et al.

(10) Patent No.: US 9,792,986 B2
(45) Date of Patent: Oct. 17, 2017

(54) PHASE CHANGE MEMORY CURRENT

(71) Applicant: Intel Corporation, Santa Clara, CA (US)

(72) Inventors: Mase J. Taub, Folsom, CA (US);
Sandeep K. Guliani, Folsom, CA (US);
Kiran Pangal, Fremont, CA (US);
Raymond W. Zeng, Sunnyvale, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/725,826

(22) Filed: May 29, 2015

(65) Prior Publication Data
US 2016/0351258 A1 Dec. 1, 2016

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0004* (2013.01); *G11C 13/0026* (2013.01); *G11C 13/0028* (2013.01); *G11C 2213/72* (2013.01); *G11C 2213/76* (2013.01); *G11C 2213/79* (2013.01)

(58) Field of Classification Search
CPC . G11C 11/16; G11C 13/0007; G11C 2213/71; G11C 13/0069; G11C 13/0004 G11C 13/003; G11C 11/161; G11C 11/1673; G11C 11/1675; G11C 13/0002; G11C 13/0011; G11C 13/004; G11C 2213/31; G11C 2213/72; G11C 2213/76; G11C 11/15; G11C 11/5607; G11C 13/0026; G11C 16/24; G11C 17/165; H01L 27/222
See application file for complete search history.

(56) References Cited

U.S. PATENT DOCUMENTS

| 3,375,503 | A | * | 3/1968 | Bertelsen | ............... G11C 11/14 365/171 |
| 6,151,261 | A | * | 11/2000 | Sato | ...................... G11C 7/067 365/207 |
| 2003/0014727 | A1 | * | 1/2003 | Roohparvar | ........ G06F 17/5077 365/189.05 |
| 2003/0156448 | A1 | * | 8/2003 | Hidaka | .................... G11C 8/08 365/171 |
| 2004/0022085 | A1 | | 2/2004 | Parkinson et al. | |

(Continued)

OTHER PUBLICATIONS

International Search Report and Written Opinion from related application PCT/US2016/030101 dated Aug. 19, 2016.

*Primary Examiner* — Son Dinh
*Assistant Examiner* — Uyen B Tran
(74) *Attorney, Agent, or Firm* — Grossman, Tucker, Perreault & Pfleger, PLLC

(57) ABSTRACT

The present disclosure relates to phase change memory current. An apparatus includes a memory controller including a word line (WL) control module and a bit line (BL) control module, the memory controller is to initiate selection of a memory cell. The apparatus further includes a mitigation module to configure a first line selection logic to reduce a transient energy dissipation of the memory cell, the transient energy related to selecting the memory cell.

18 Claims, 6 Drawing Sheets

(56) References Cited

U.S. PATENT DOCUMENTS

2006/0209600 A1* 9/2006 Le Phan .................. G11C 7/22
                                                365/51
2007/0297221 A1  12/2007 Philipp et al.
2009/0027975 A1   1/2009 Kang et al.
2009/0043973 A1   2/2009 Kang et al.
2013/0051139 A1   2/2013 Dodge et al.
2014/0362650 A1* 12/2014 Castro ................ G11C 13/0004
                                                365/189.011

* cited by examiner

PHASE CHANGE MEMORY CURRENT

FIELD

The present disclosure relates to phase change memory current.

BACKGROUND

Phase change memory is a memory device which typically uses a chalcogenide material for the memory elements. A memory element is the unit that actually stores information. In operation, the phase change memory stores information on the memory element by changing the phase of the memory element between amorphous and crystalline phases. The chalcogenide material may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell that also includes a selector, i.e., a select device coupled to the memory element. The select devices are configured to facilitate combining a plurality of memory elements into an array.

Phase change memory cells may be arranged in a cross-point memory array including row address lines and column address lines arranged in a grid. The row address lines and column address lines, called word lines (WLs) and bit lines (BLs), respectively, cross in the formation of the grid and each memory cell is coupled between a WL and a BL where the WL and BL cross (i.e., cross-point). It should be noted that row and column are terms of convenience used to provide a qualitative description of the arrangement of WLs and BLs in cross-point memory.

A memory cell may be selected by applying bias voltages to the WL and BL that cross at the memory cell. A resulting memory cell differential bias voltage across the memory cell is configured to be greater than a threshold select voltage for the memory cell. For a read operation, the threshold select voltage is generally greater than a maximum set voltage and less than a minimum reset voltage. For a write operation, i.e., programming operation, the threshold select voltage is generally greater than a maximum reset voltage.

In a read operation, the differential bias voltage across the memory element is configured to be greater than a maximum set voltage and less than a minimum reset voltage for the memory element. In response, the target memory element may or may not "snap back", depending on whether the memory element is in the crystalline state (set) or the amorphous state (reset). Snap back is a property of the composite memory element that results in an abrupt (e.g., on the order of tens of picoseconds) increase in conductivity (and corresponding decrease in resistance) of the memory element. Sense circuitry, coupled to the memory element, is configured to detect the presence or absence of snap back in a sensing time interval. The presence of snap back may then be interpreted as a logic one and the absence of snap back as a logic zero.

During a programming operation, the differential bias voltage may be maintained across the memory cell for a first time period sufficient to cause the memory element to snap back. Current through the memory element may then be controlled for a second time period to transition the memory element from the amorphous state to the crystalline state or from the crystalline state to the amorphous state.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
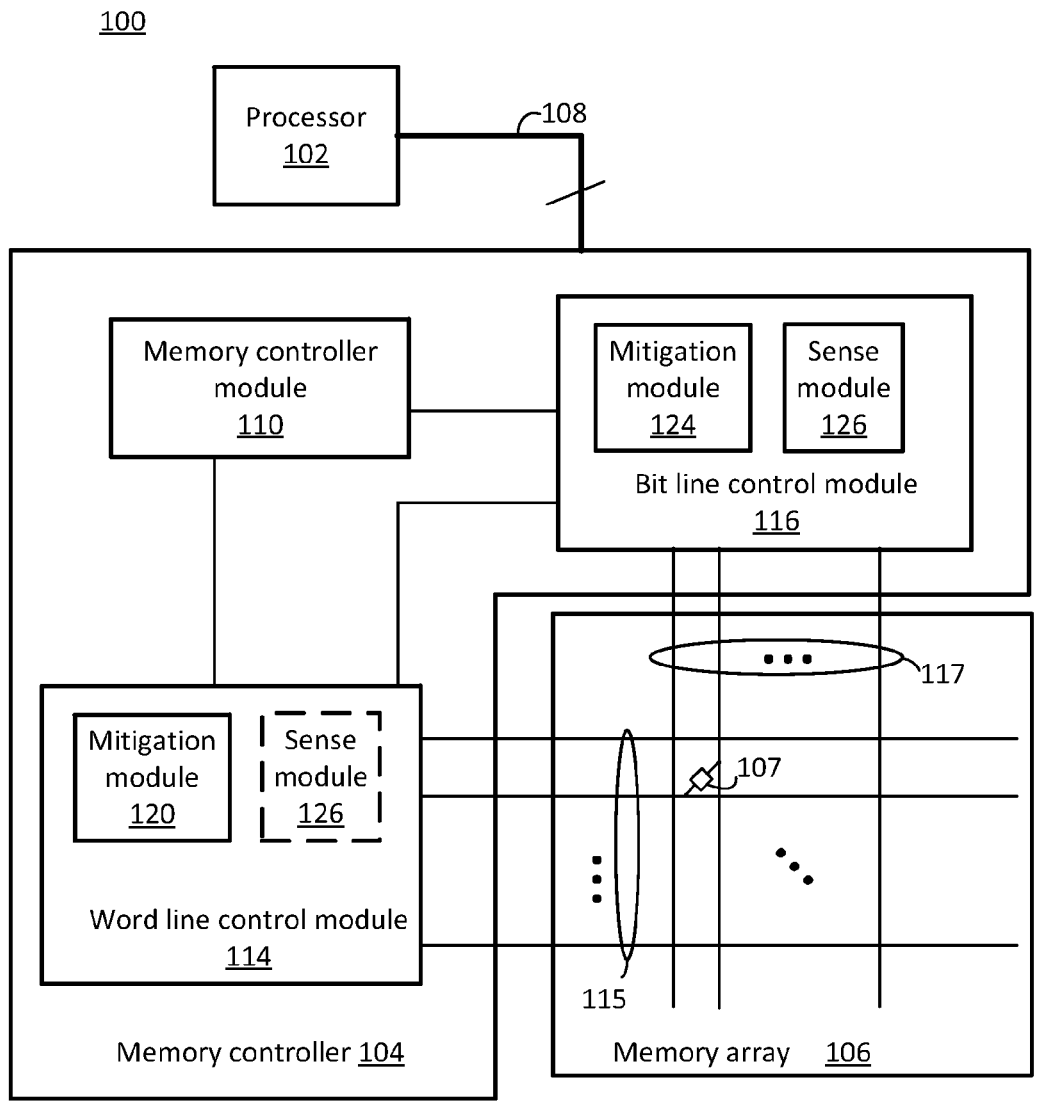
FIG. 1 illustrates a system block diagram, consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

When snap back occurs, a resistance associated with the memory cell decreases abruptly, for example, from an approximately open circuit to a finite resistance in a time interval on the order of tens of picoseconds. Prior to snap back, selected WL(s), selected BL(s), associated capacitances and/or sense circuitry may be charged to respective bias voltage(s). When snap back occurs, the change in resistance in the memory cell creates a current path that allows a transient current to flow between the selected WL(s) and selected BL(s) via the memory cell. The current is maximum just after snap back as the capacitances begin to charge (or discharge) resulting in a current spike (i.e., transient current) that decays over time. Thus, the transient current has a peak amplitude and a duration related to, inter alia, impedance in the current path. An amount of energy dissipated by the memory cell is related to the peak current (i.e., maximum transient current) and the rate of decay of the transient current. Such a current spike may damage a memory cell, cause the memory cell to not set or reset properly during a set or reset state write operation, increase the memory cell threshold voltage so that the memory cell state will be read as a reset state (absence of snap back during a read operation) and/or induce thermal disturb of neighboring memory cell(s).

The maximum energy dissipated may be reduced and/or limited by increasing a resistance in the current path. Increasing the resistance to limit the energy dissipated may result in limiting a steady state current to a value that is less than a hold current (a minimum current to maintain a memory cell selected). When memory cell current is less than the hold current, the memory cell may oscillate, cycling between selected and not selected. Increasing the resistance in the current path to limit the energy dissipated may result in a decreased programming current for a same differential bias voltage across the memory cell. Such decreased programming current may degrade programming efficiency and may dissipate relatively more programming current in the increased resistances.

Generally, this disclosure describes a system and method configured to control current through a selected memory cell in phase change memory. The system and method are configured to reduce energy dissipated by a memory cell during memory cell selection by reducing a transient current as a function of time. The method and system are further configured to maintain a steady state current of the selected memory cell at or above a hold current for the memory cell. The method and system are configured to configure line selection logic to reduce a change in voltage triggered by the memory cell selection. The reduced change in voltage may then result in a corresponding reduction in a duration of the transient current and thus a reduction in the energy dissipated during selection of the memory cell. The method and system are further configured to configure the line selection logic to allow a relatively larger current during memory access operations, i.e., reading and/or writing. The system and method are configured to increase a resistance of the selected memory cell current path during the memory cell selection current transient and to reduce the resistance of the selected memory cell current path during reading and/or programming.

The system may include a first current source (Iselection source) and a second current source (Ipulse source). The Iselection source is configured to supply a current greater than or equal to a minimum hold current, Ihold, for a selected memory cell. Ihold is an amount of current configured to maintain a selected memory cell in a selected state. The Ipulse source is configured to supply a pulse current (Ipulse), to the memory cell current path. Pulse current(s) correspond to memory access current(s) and may include read and/or programming current(s), FIG. 1 illustrates a system block diagram 100 consistent with several embodiments of the present disclosure. The system 100 includes a processor 102, a memory controller 104 and a memory array 106. The processor 102 is coupled to the memory controller 104 by bus 108. Processor 102 may provide memory access request(s) (i.e., read and/or write request(s)) including memory address(es), and/or associated data to memory controller 104 and may receive read data from memory controller 104. It should be noted that system 100 is simplified for ease of illustration and description.

Memory array 106 corresponds to at least a portion of a phase change cross-point memory and includes a plurality of word lines 115, a plurality of bit lines 117 and a plurality of memory cells, e.g., memory cell 107. Each memory cell is coupled between a word line ("WL") and a bit line ("BL") at a cross point of the WL and the BL. Each memory cell includes a memory element configured to store information and may include a memory cell select device coupled to the memory element. Select devices may include ovonic threshold switches, diodes, bipolar junction transistors, field-effect transistors, etc. Memory array 106 is configured to store binary data and may be written to (i.e., programmed) or read from.

Memory controller 104 includes memory controller module 110, WL control module 114 and BL control module 116. Memory controller module 110 is configured to perform operations associated with memory controller 104. For example, memory controller module 110 may manage communications with processor 102. Memory controller module 110 may be configured to identify one or more target WLs associated with each received memory address. Memory controller module 110 is configured to manage operations of WL control module 114 and BL control module 116 based, at least in part, on the identified target WL.

WL control module 114 may include a mitigation module 120. In some embodiments, WL control module 114 may include a sense module 126. WL control module 114 is configured to receive target WL address(es) from memory controller module 110 and to select one or more WLs for reading and/or writing operations. WL control module 114 may be configured to select a target WL by coupling $V_{SELWL}$ (i.e., WL select bias voltage) to the target WL. WL control module 114 may be coupled to a plurality of WLs 115 included in memory array 106. Each WL may be coupled to a number of memory cells corresponding to a number of BLs 117.

BL control module 116 may include a mitigation module 124 and/or the sense module 126. BL control module 116 is configured to select one or more BLs for reading and/or writing operations. BL control module 116 may be configured to select a target BL by coupling $V_{SELBL}$ (i.e., BL select bias voltage) to the target BL.

Mitigation module 120 and/or mitigation module 124 are configured to reduce and/or minimize transient energy dissipated by a memory cell, e.g., memory cell 107, during selection through memory cell 107 by adjusting a current path resistance in the current path that couples BL control module 116 to WL control module 114 via memory cell 107. For example, mitigation module 120 and/or mitigation module 124 may be configured to adjust a first line select control input to first line selection logic and/or a second line select control input to a second line selection logic to configure the respective selection logic to reduce a transient energy dissipation during memory cell selection, as described herein. The respective adjusted line select control input may be configured to increase the current path resistance and reduce a related voltage swing to reduce the transient energy dissipation during memory cell selection. In another example, mitigation module 120 and/or mitigation module 124 may be configured to adjust the first line select control input (e.g., voltage) to the first line selection logic and/or the second line select control input (e.g., voltage) to the second line selection logic to configure the respective selection logic to decrease the current path resistance and increase allowable current during memory cell programming. Increasing the allowable current is configured to facilitate heating the memory cell, the heating related to memory cell programming. Mitigation module 120 and/or mitigation module 124 may each include an Iselection current source and/or an Ipulse current source, as described herein.

Figure 2:
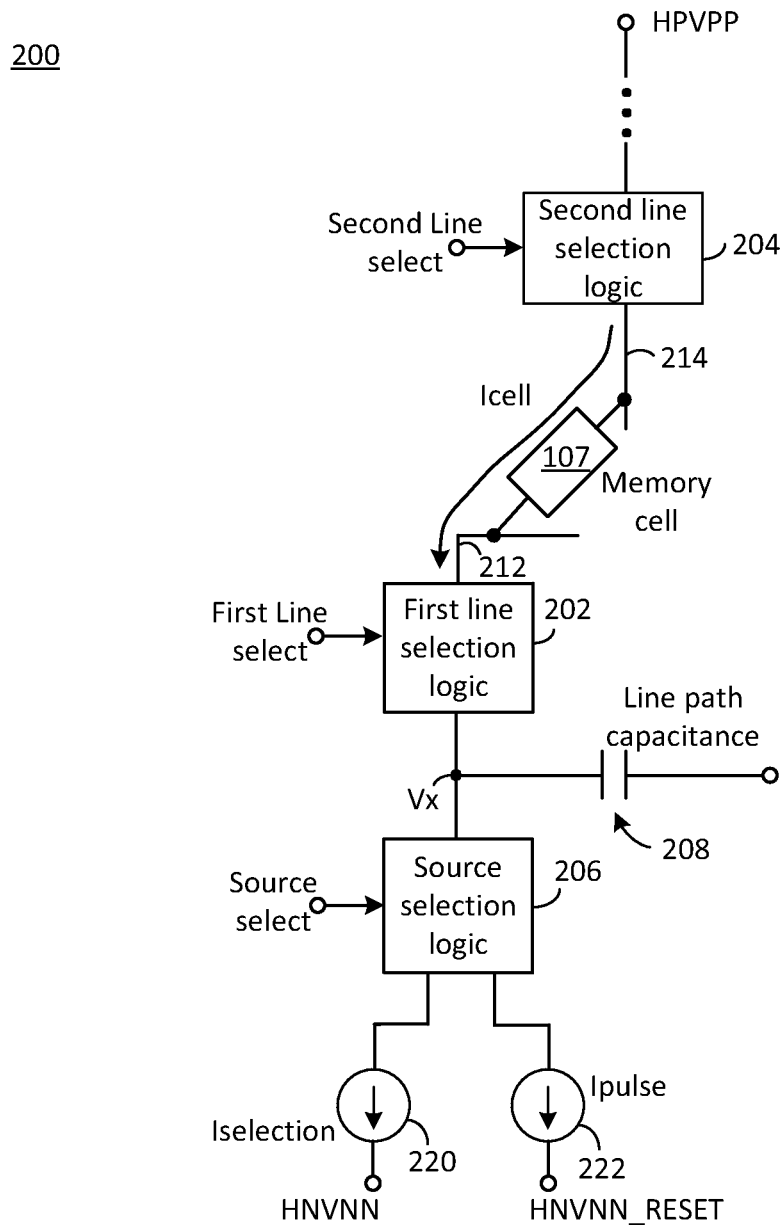
FIG. 2 illustrates an example current path block diagram, consistent with various embodiments of the present disclosure.

FIG. 2 illustrates an example current path block diagram 200, consistent with various embodiments of the present disclosure. The current path 200 includes memory cell 107, first line selection logic 202, second line selection logic 204, a line path capacitance 208, a first line 212 and a second line 214. The current path 200 may include source selection logic 206, a selection current source 220 and a pulse current source 222. The pulse current source 222 is configured to provide a memory access current, Ipulse. The memory cell 107 is coupled to the first line selection logic 202 by the first line 212 and to the second line selection logic 204 by the second line 214.

The selection logic 202, 204, 206 and/or current sources 220, 222 may be included in memory controller 104 and mitigation module 120 and/or mitigation module 124 of FIG. 1. The WL control module 114 and/or BL control module 116 may then be configured to provide control inputs to the selection logic 202, 204 and/or 206, as described herein.

The example current path 200 is simplified for ease of illustration and description. For example, global WLs and global BLs are not explicitly shown. The lines 212, 214 correspond to local lines (i.e., a local WL and a local BL, respectively, or a local BL and a local WL, respectively). The line path capacitance 208 is related to a global WL or a global BL and may be related to sense circuitry, as described herein.

In an embodiment, the first line 212 may correspond to a WL and the second line 214 may correspond to a BL. In another embodiment, the first line 212 may correspond to a BL and the second line may correspond to a WL. The first line selection logic 202 and the second line selection logic 204 are configured to select the target memory cell 107 by providing a differential bias voltage across the memory cell 107 greater than or equal to a threshold voltage of the memory cell. For example, the first line selection logic 202 may be configured to couple the first line 212 and thus the memory cell 107 to a first bias voltage and the second line selection logic 204 may be configured to couple the second line 214 and thus the memory cell 107 to a second bias voltage. A resulting differential bias voltage across memory cell 107 may then correspond to a difference between the first and second bias voltages. The first line selection logic 202 and the second line selection logic 204 may include, but are not limited to, a transistor (e.g., metal oxide semiconductor field effect transistor (MOSFET), bipolar junction transistor (BJT), etc.), a switch, etc.

Line path capacitance 208 may include one or more capacitance(s) (e.g., parasitic capacitance(s)) associated with a path between the first line selection logic 202 and the source selection logic 206. For example, line path capacitance 208 may include one or more local (WL or BL) capacitances, global line (WL or BL) capacitances and/or capacitance associated with sense circuitry, programming selection circuitry and/or programming circuitry. Line path capacitance 208 may further include capacitance other than WL and/or BL capacitances. Initiating selection of memory cell 107 may include charging line path capacitance 208 to a charge and voltage related to the first bias voltage. If memory cell 107 snaps back in response to being selected, a transient current may flow to line path capacitance 208 via node Vx until a steady state voltage (and charge) is reached. The transient current includes a current Icell through the memory cell.

The first line selection logic 202 is configured to receive a first line select control input and the second line selection logic 204 is configured to receive a second line select control input. The first line select control input and/or the second line select control input may be received from mitigation module 120 and/or mitigation module 124 of FIG. 1. For example, for line selection logic 202, 204 that correspond to MOSFETs, the control inputs correspond to gate voltages. Continuing with this example, the first line select control input (voltage) minus voltage Vx correspond to a gate-source bias voltage $V_{GS}$ for first line selection logic 202. Adjusting the first line select control input may increase or decrease a drain-source resistance ($R_{DS}$) of the first line selection logic 202. The current through first line selection logic 202 corresponds to memory cell 107 current, Icell. Adjusting the first line select control input may increase or decrease a change in Vx ($\Delta$Vx) during selection. For example, for $\Delta$Vx=Vxf−Vxi, where Vxi is the voltage at Vx just prior to snap back and Vxf is the steady state voltage at Vx after snap back, a relatively larger $R_{DS}$ may correspond to a relatively smaller $\Delta$Vx and a relatively smaller $R_{DS}$ may correspond to a relatively larger $\Delta$Vx. The charge, Q, on a capacitor, e.g., line path capacitance 208, is Q=C*V, where C is capacitance and V is voltage. A change in voltage across a capacitor corresponds to a change in charge, i.e., $\Delta$Q=C*$\Delta$V. A relatively smaller $\Delta$Vx then corresponds to a relatively smaller change in charge $\Delta$Q. A relatively smaller change in charge may then correspond to a transient voltage on the first line 212 achieving a steady state value relatively faster compared to a relatively larger $\Delta$Q (and corresponding relatively larger $\Delta$Vx). The voltage on line 212 achieving steady state relatively faster may then correspond to relatively less energy dissipation by memory cell 107 during the selection transient. Thus, based, at least in part, on the bias voltage applied to the first line selection logic 202, Vx may be constrained by the first line selection logic 202. In other words, decreasing the bias voltage may increase the drain-source resistance resulting in a relatively smaller change in voltage on the line path capacitance 208 from its value prior to memory cell snap back. The relatively smaller voltage change may then correspond to a relatively shorter duration current transient and relatively less energy dissipation by the memory cell.

The source selection logic 206 is configured to couple the first current source 220 or the second current source 222 to the first line selection logic 202 and the line path capacitance 208. The source selection logic 206 may include, but is not limited to, one or more transistor(s) (e.g., MOSFET, BJT, etc.), switch(es), etc. The current sources 220, 222 may include, but are not limited to, current minors, constant current sources, etc. The current sources 220, 222 may include, for example, one or more transistors that are biased to provide a respective current that may be independent of load. The source selection logic 206 is configured to receive a source select control input. The source select control input is configured to control the source selection logic 206 and associated coupling and/or decoupling, as described herein.

The selection current source 220 is configured to provide a selection current, Iselection, to memory cell 107 after the current transient, i.e., during steady state. The steady state selection current is configured to be at or above a minimum hold current (Ihold) associated with memory cell 107. The minimum hold current for a memory cell is configured to avoid cell selection oscillation. In other words, a selection current that is less than Ihold for a cell corresponds to a steady state Icell current that is less than Ihold. When Icell is less than Ihold, the memory cell may not remain selected and the memory cell may return to its high impedance state, i.e., may turn off. After the memory cell turns off, the line path capacitance 208 may then charge to its initial preselect value, the memory cell may again snap back initiating the memory cell current transient and the cycle may repeat. In order to avoid such oscillation, the selection current Iselection is configured to have a value that is greater than or equal to Ihold. When Iselection is greater than or equal to Ihold, the selected memory cell may be maintained selected due, at least in part, to Iselection. Thus, the selection current is configured to be at or above a minimum hold current associated with memory cell 107 in steady state.

The pulse current source Ipulse 222 is configured to provide a pulse current, Ipulse, to the selected memory cell 107. Pulse current corresponds to a memory access current and may include a read current and/or one or more programming currents. Programming currents are typically larger than selection and/or read currents. First line select control input may be adjusted to reduce the resistance associated with the first line selection logic 202 and to increase the allowable current through the first line selection logic 202 prior to and/or during reading and/or programming operations. The relatively lower resistance may be relatively more energy efficient by dissipating less energy as heat. The relatively higher allowable current is configured to facilitate memory access operations. For example, for a first line selection logic 202 that corresponds to a MOSFET, the bias voltage, $V_{GS}$ may be increased to decrease $R_{DS}$ and to increase an amount of current that may flow through the first line selection logic 202.

Thus, the first line selection logic 202 may be controlled to reduce the transient current as a function of time (and thus energy dissipation) through memory cell 107 associated with selection. The Iselection current source 220 and the first line selection logic 202 are configured to maintain Icell at or above Ihold while the memory cell 107 is selected. The first line selection logic 202 may be further controlled to allow an increased Icell during reading and/or programming operations.

Figure 3A:
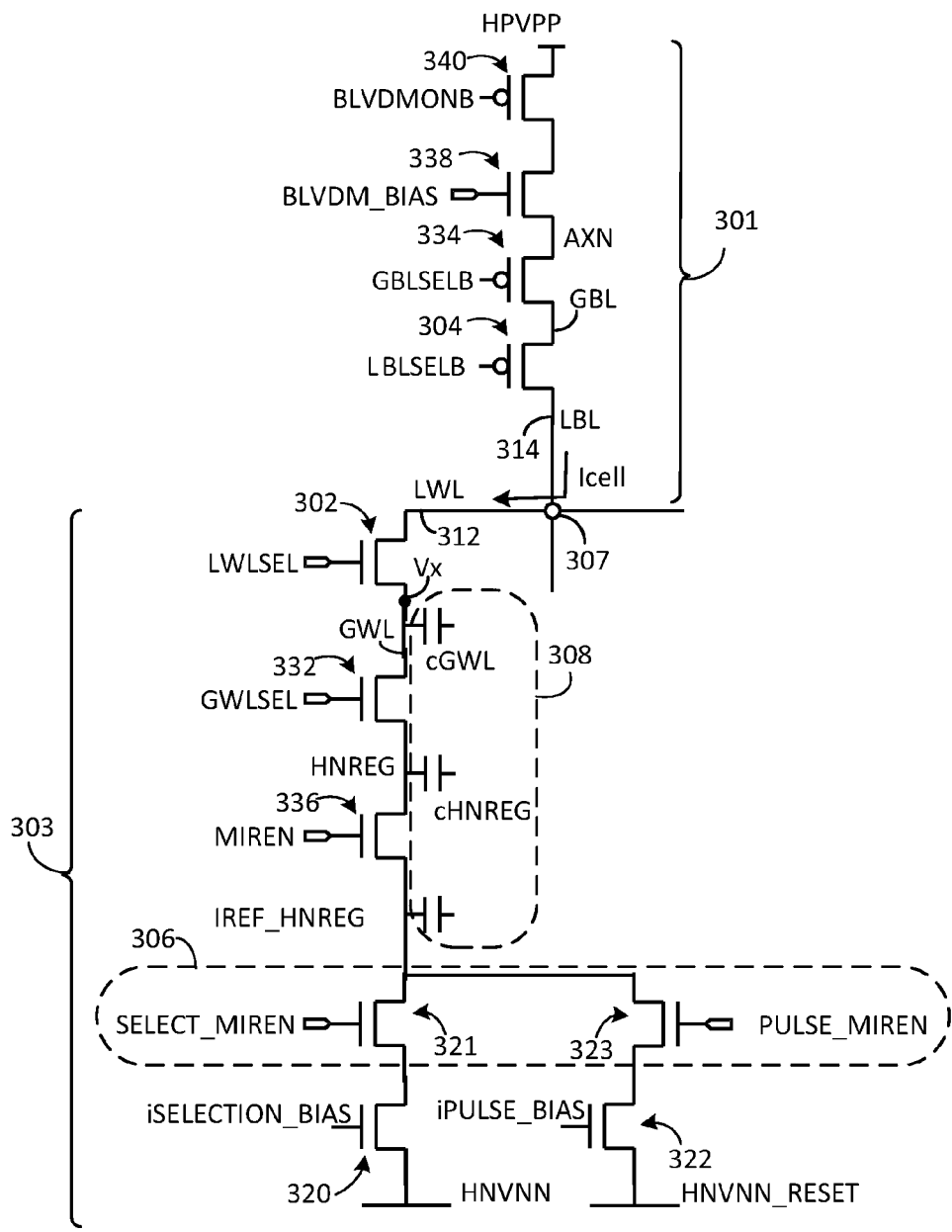
FIG. 3A illustrates one example memory cell current path block diagram, consistent with one embodiment of the present disclosure.

FIG. 3A illustrates one example memory cell current path 300 block diagram, consistent with one embodiment of the present disclosure. In this example, a BL portion 301 of the current path 300 is configured to be relatively low impedance when a memory cell is selected and an impedance of a WL portion 303 is configured to vary, i.e., to be controlled, during selection and/or memory access operations, as described herein. The WL portion 303 may further be coupled to sense circuitry (not shown). In another embodiment, a WL portion of a current path may be relatively low impedance when a memory cell is selected, impedance of a BL portion may be controlled and the BL portion may be coupled to sense circuitry. In this embodiment, the WL portion may then include a respective functionality of corresponding transistors 338, 340 and BL portion may then include a respective functionality of corresponding elements 306, 320, 322, 336.

Current path 300 includes memory cell 307, a local WL (LWL) select transistor 302, a LWL 312, a local BL (LBL) select transistor 304, a LBL 314, a line path capacitance 308, source selection logic 306, an Iselection current source 320 and an Ipulse current source 322. Iselection current source 320 is coupled to a voltage source HNVNN and an Ipulse current source 322 is coupled to a voltage source HNVNN_RESET. HNVNN_RESET is slightly more negative than HNVNN to maximize RESET current capability.

In this example 300, memory cell 307 is one example of memory cell 107, LWL select transistor 302 corresponds to the first line selection logic 202, LWL 312 corresponds to first line 212, LBL select transistor 304 corresponds to the second line selection logic 204, LBL 314 corresponds to the second line 214, line path capacitance 308 corresponds to line capacitance 208, source selection logic 306 corresponds to source selection logic 206, Iselection current source 320 corresponds to Iselection current source 220 and Ipulse current source 322 corresponds to Ipulse current source 222 of FIG. 2.

Current path 300 further includes a global WL (GWL), a GWL select transistor 332, a global BL (GBL), a GBL select transistor 334, a current source enable transistor 336, a BL bias transistor 338 and a BL monitor transistor 340. BL monitor transistor 340 is coupled to a supply voltage HPVPP. Source selection logic 306 includes a selection current source enable transistor 321 and a pulse current source enable transistor 323. Line capacitance 308 includes capacitance cGWL associated with GWL, capacitance cHN-REG associated with sense circuitry.

Operation of current path 300 may be controlled, for example, by memory controller 104 and/or BL control module 116 of FIG. 1. Current path 300 is configured to illustrate selecting and programming memory cell 307. Generally, selection includes applying bias voltages to the LBL 314 and the LWL 312 to produce a differential bias voltage across the memory cell 307 that is greater than or equal to the memory cell threshold voltage. Once the memory cell 307 is selected, programming current(s) may be applied to the memory cell 307 for predefined duration(s) to achieve programming. Operation of current path 300 may be best understood when considered in combination with FIG. 3B.

Figure 3B:
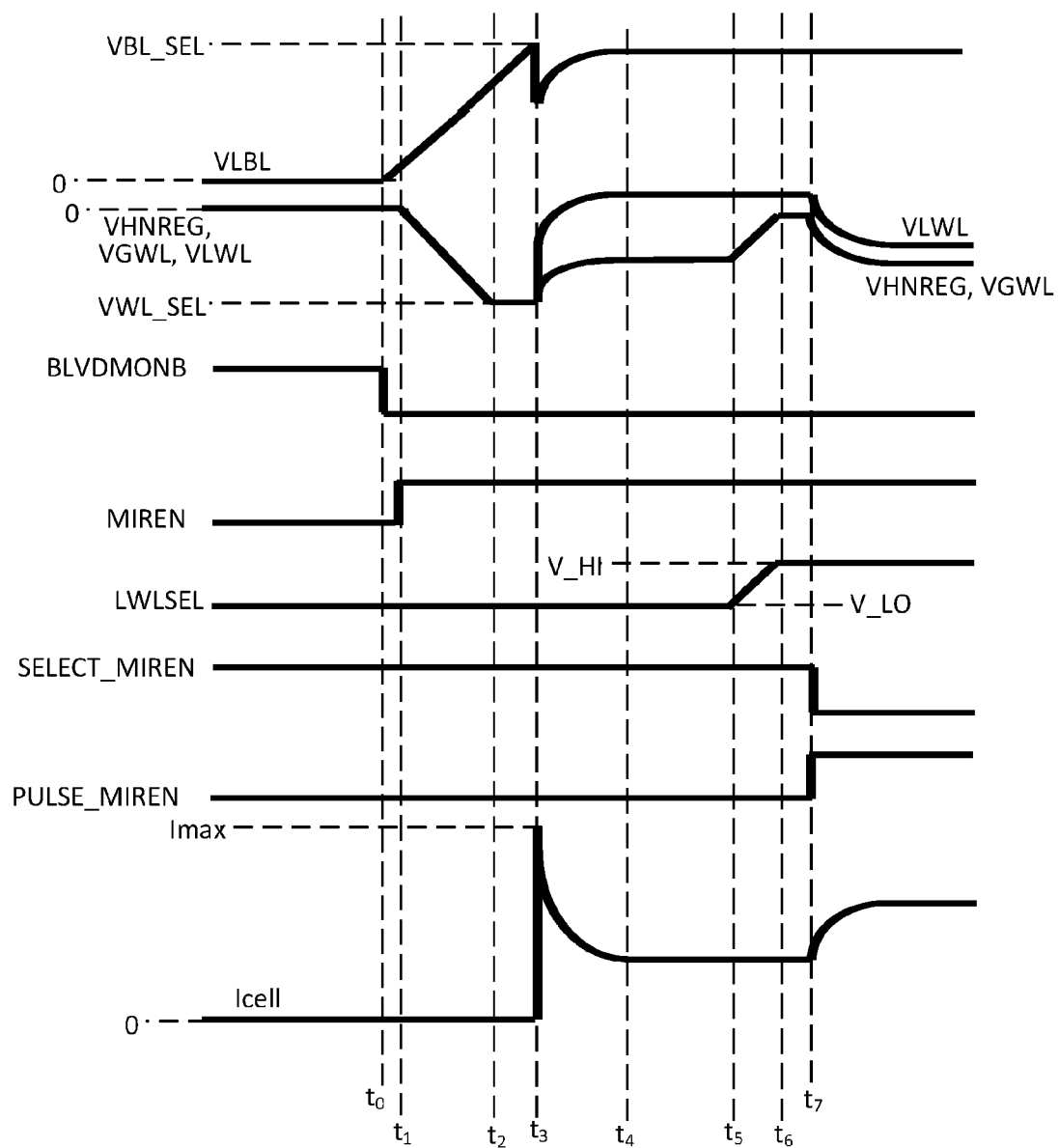
FIG. 3B illustrates an example timing diagram for the current path block diagram of FIG. 3A.

FIG. 3B illustrates an example timing diagram 350 associated with the current path 300 block diagram of FIG. 3A. Timing diagram 350 includes voltage waveforms and a current waveform as functions of time. The voltage and current waveforms are related to selecting a memory cell, e.g., memory cell 307, and performing a memory access operation on the selected memory cell 307. Timing diagram 350 includes LBL 314 voltage VLBL, LWL 312 voltage VLWL, VGWL and VHNREG voltages, BL control input BLVDMONB, current source enable input MIREN, LWL 312 select control input voltage LWLSEL, selection current source 320 enable SELECT_MIREN, pulse current source enable PULSE_MIREN and cell current Icell. It should be noted that not all of the control input signals that may be associated with current path 300 are included in timing diagram 350, for ease of illustration and description.

Generally, in order to select memory cell 307, LBL 314 may be biased to a LBL select voltage VBL_SEL by operation of BL bias transistor 338, BL-VDMONB transistor 340, GBL select transistor 334 and LBL select transistor 304 and LWL 312 may be biased to a LWL select voltage VWL_SEL by operation of LWL select transistor 302, GWL select transistor 332, current source enable transistor 336 and source selection logic 306. A difference between VBL_SEL and VWL_SEL (i.e., differential bias voltage) is configured to be greater than or equal to a threshold voltage associated with memory cell 307.

Turning now to FIG. 3B, initially, prior to time t0, VLBL, VHNREG, VGWL and VLWL are at or near zero; BLVDMONB and SELECT_MIREN are high and MIREN and PULSE_MIREN are low. "Low" and "high" in this context refer to control input signal voltages. BLVDMONB high corresponds to BL not selected. SELECT_MIREN high corresponds to the selection current source 320 enabled. MIREN and PULSE_MIREN low correspond to the current sources 320 and 322 not coupled to the current path 300 and the pulse current source 322 disabled, respectively. Prior to time t0, Icell, the current through memory cell 307, is at or near zero. LWLSEL, a control input to LWL select transistor 302, is at V_LO. V_LO is configured to bias (i.e., $V_{GS}$=V_LO−Vx) the LWL select transistor 302 to a level less than maximum bias, i.e., less than full ON. $V_{GS}$ less than maximum may then result in an increased resistance ($R_{DS}$) between LWL 312 and GWL compared to a relatively higher $V_{GS}$.

At time t0, BLVDMONB transitions from high to low, turning on transistor 340 and coupling the LBL 314 and memory cell 307 to a voltage supply HPVPP. VLBL begins to increase towards VBL_SEL. At time t1, MIREN transitions from low to high, turning on transistor 336 and coupling GWL to the selection current source 320. Memory cell 307 may also be coupled to the selection current source 320 via LWL select transistor 302 and GWL. Voltages VHNREG, VGWL and VLWL begin to ramp down toward VWL_SEL. At time t2, voltages VHNREG, VGWL and VLWL reach VWL_SEL and VLBL continues to ramp up towards VBL_SEL.

At time t3, VLBL minus VLWL (i.e., differential bias voltage) reaches the threshold voltage (VBL_SEL minus VWL_SEL) for the memory cell 307, the memory cell snaps back and VLBL decreases abruptly. A transient current (Icell) begins to flow through the memory cell and LWL select transistor 302. This transient current is illustrated by the spike from zero to Imax at time t3 and the decay between time t3 and time t4. The transient current (as a function of time) and the energy dissipated by memory cell 307 are related to the resistance of LWL select transistor 302 and the change in voltage Vx (i.e., VGWL) from just prior to time t3 to steady state between time t3 and time t4, as described herein. In other words, the energy dissipated by memory cell 307 for LWLSEL=V_LO (i.e., $V_{GS}$<$V_{GS}$ maximum) is less than the energy dissipated for maximum $V_{GS}$ for LWL select transistor 302.

During a time interval between time t3 and time t4, VLBL, VHNREG, VGWL and VLWL increase to respective steady state values and Icell decreases to a steady state value. The increases in VLBL and VLWL occur with time constant(s) related to the line path capacitance 308, other parasitic capacitances associated with the LWL and LBL and the resistance of the LWL select transistor 302. The increases in VHNREG and VGWL, i.e., ΔVx, are related to LWLSEL and the corresponding bias voltage $V_{GS}$ of LWL select transistor 302. The decrease in Icell occurs with a time constant related to the line path capacitance 308 and other parasitic capacitances associated with the LWL and LBL, the resistance of the LWL select transistor 302 and ΔVx. In other words, the decrease in Icell is relatively faster for LWLSEL=V_LO, resulting in relatively less energy dissipation by memory cell 307 during the selection transient compared to, for example, LWLSEL=V_HI.

At time t4, voltages VLBL, VHNREG, VGWL and VLWL and current Icell have achieved respective steady state values. The steady state voltages related to line path capacitance 308, i.e., VHNREG and VGWL, may be less than the steady state voltage VLWL for the LWL 312. For example, LWLSEL equal to V_HI may correspond to a minimum $R_{DS}$ and maximum allowable current ($I_{DS}$) through transistor 302. $I_{DS}$ corresponds to Icell. V_LO is less than V_HI and LWLSEL equal to V_LO may thus correspond to a relatively higher $R_{DS}$ and a relatively lower $I_{DS}$ for transistor 302 compared to $I_{DS}$ when LWLSEL is equal to V_HI. The voltage difference between VWL and VHNREG and VGWL may then be related to $I_{DS}$ and $R_{DS}$. In other words, Vx=VGWL≈VHNREG and VLWL differs from the Vx by the voltage drop across LWL select transistor 302. For example, for VWL_SEL equal to −3.6 volts and LWLSEL equal to V_HI (e.g., 0 volts) during selection (i.e., Icell current not limited), VHNREG and VGWL may increase to about −1 volt by time t4, a change in voltage of 2.6 volts. In contrast, for VWL_SEL equal to −3.6 volts and LWLSEL equal to V_LO (e.g., −2 volts) during selection (i.e., Icell limited), VHNREG and VGWL may increase to about −3 volt by time t4, a change in voltage of 0.6 volts. Thus, line path capacitance 308 may experience a relatively smaller change in charge and voltage when $R_{DS}$ is relatively higher compared to $R_{DS}$ relatively smaller. A small change in voltage corresponds to a lesser energy transfer to line path capacitance 308 in response to the snap back at time t3.

LWLSEL equal to V_LO is configured to limit the transient current (and thus, energy dissipation) through memory cell 307 during the time interval between time t3 and time t4. V_LO may be further configured to maintain Icell greater than or equal to the hold current (Ihold) for memory cell 307. In other words, V_LO corresponds to a bias voltage configured to yield $I_{DS}$ of the LWL select transistor 302 greater than or equal to Ihold. Thus, oscillation of memory cell 307 between selected and unselected may be avoided.

At time t5, LWLSEL may begin to increase from V_LO toward V_HI. Increasing LWLSEL is configured to reduce $R_{DS}$ and increase an allowable $I_{DS}$ in anticipation of applying Ipulse to memory cell 307. VHNREG and VGWL may also begin to increase as $R_{DS}$ decreases. At time t6, LWLSEL reaches V_HI and transistor 302 is thus configured to pass Ipulse current.

At time t7, control input SELECT_MIREN transitions from high to low, deselecting selection current source 320. Control input PULSE_MIREN transitions from low to high, enabling Ipulse current source 322. Icell begins to increase, VLWL begins to decrease and VHNREG and VGWL begin to decrease. The changes in Icell, VWL, VHNREG and VGWL are not instantaneous, rather they occur with a nonzero time constant. The time constant is related to line capacitance 308 and the resistance of memory cell 307.

Thus, by controlling the bias voltage of a LWL select transistor (e.g., transistor 302), memory cell selection energy dissipation may be limited (i.e., reduced), memory cell current may be maintained at or above the hold current for the memory cell and allowable memory cell current may be increased to facilitate programming. Memory cell current may also be related to current provided by current sources 320, 322.

Figure 4A:
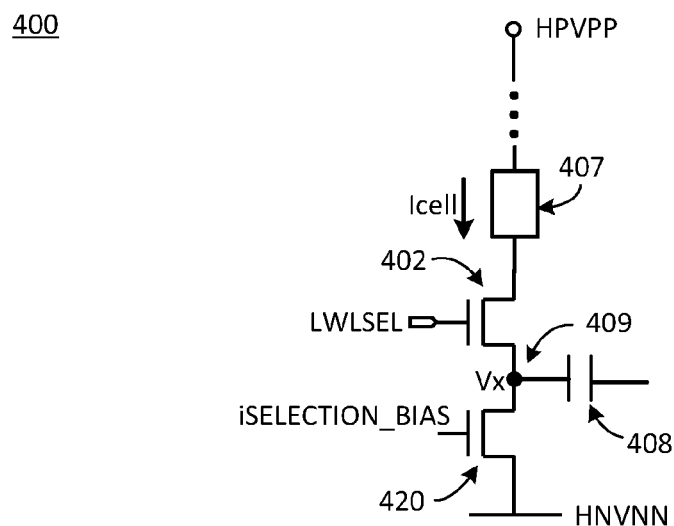
FIG. 4A illustrates a simplified memory cell current path block diagram, consistent with one embodiment of the present disclosure.
Figure 4B:
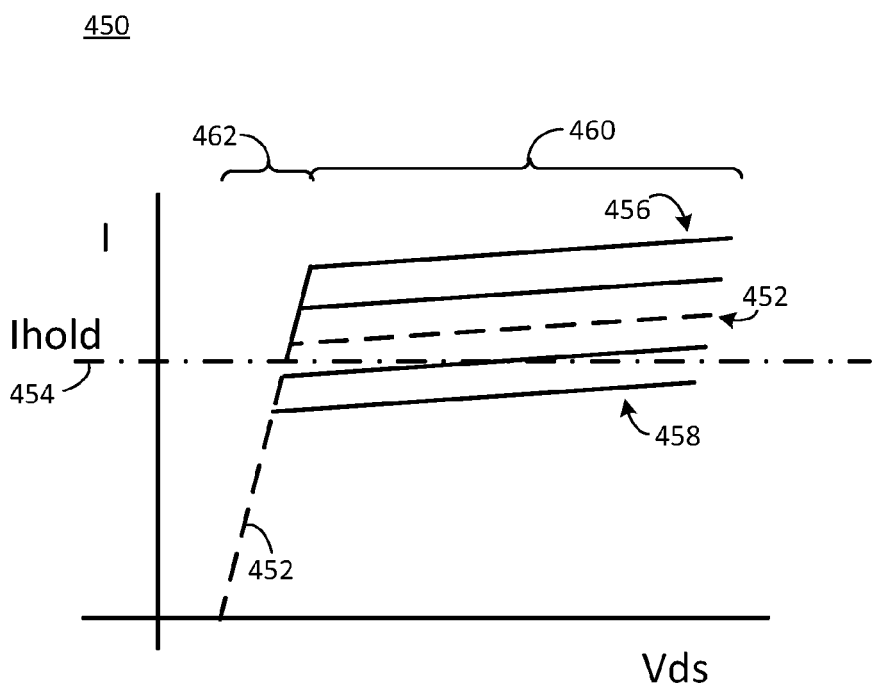
FIG. 4B is a plot of transistor output characteristic waveforms related to the current path of FIG. 4A.

FIG. 4A illustrates a simplified memory cell current path block diagram 400, consistent with one embodiment of the present disclosure. FIG. 4B is a plot of transistor output characteristic waveforms 450 related to the current path of FIG. 4A. FIGS. 4A and 4B may be best understood when considered together.

Turning first to FIG. 4A, simplified current path 400 corresponds to current path 300 of FIG. 3A. Current path 400 includes a memory cell 407, LWL select transistor 402, a selection current source transistor 420 and line path capacitance 408. Current path 400 is simplified to highlight an interaction between first line selection logic, i.e., LWL select transistor 402, and selection current source, i.e., transistor 420. LWL select transistor 402, selection current source transistor 420 and line path capacitance 408 are coupled at node 409. Vx is a voltage associated with node 409.

For example, for transistors 402 and 420 that are MOSFETs, a source of LWL select transistor 402 is coupled to a drain of the selection current source transistor 420 at node 409. A gate of the LWL select transistor 402 is configured to receive a control input LWLSEL and a gate of the selection current source transistor 420 is configured to receive a control input iSELECTION_BIAS.

During operation, the voltage Vx at node 409 is related to operation of current path 400 and the effects of adjusting control inputs LWLSEL and iSELECTION_BIAS. Vx is related to the bias voltage, $V_{GS}$, applied to LWL select transistor 402 and to the bias voltage applied to selection current source transistor 420. Selection current source transistor 420 is configured as a current mirror, i.e., current is independent of load.

Turning to FIG. 4B, plot 450 includes a plurality of $I_{DS}$ versus $V_{DS}$ waveforms for a range of bias voltages, $V_{GS}$, for transistors 402 and 420. Waveform 452 corresponds to $I_{DS}$ vs $V_{DS}$ for transistor 420 for the control input iSELECTION_BIAS. iSELECTION_BIAS corresponds to a target operating bias for selection current source transistor 420, i.e., Iselection greater than or equal to Ihold. Plot 450 further includes $I_{DS}$ waveforms, e.g., waveforms 456, 458, for LWL select transistor 402 for a range of values of $V_{GS}$. Plot 450 illustrates a saturation region 460 and a linear (i.e., ohmic) region 462 for the $I_{DS}$ vs $V_{DS}$ waveforms. Plot 450 includes LWL select transistor 402 $I_{DS}$ waveforms for $I_{DS}$ greater than transistor 420 $I_{DS}$ waveform 452 in saturation, e.g., waveform 456, and transistor 402 $I_{DS}$ waveforms less than transistor 420 $I_{DS}$ waveform 452 in saturation, e.g., waveform 458. Plot 450 further includes a constant current line 454 representing Ihold for memory cell 407.

The selection current, Iselection, is configured to be greater than Ihold when transistor 420 is in saturation in order to maintain the memory cell 407 selected and avoid oscillation. LWLSEL is similarly configured to bias transistor 402 at or above Iselection, i.e., at or above selection transistor waveform 452 in saturation. Biasing transistor 402 for a load current $I_{DS}$ greater than or equal to Iselection is configured to avoid transistor 402 limiting Icell to less than Iselection and to thus avoid limiting Icell to less than Ihold.

In operation, transistor 402 is configured to operate in the saturation region 460 and transistor 420 may or may not be operating in the saturation region 460. When transistor 402 is biased such that transistor 402 is saturated and operating at or above selection transistor waveform 452, transistor 420 is configured to be saturated and Icell corresponds to Iselection. When transistor 402 is biased such that transistor 402 is saturated and operating below selection transistor waveform 452, transistor 420 may be operating in the linear region 462 (no longer independent of load) and Icell corresponds to $I_{DS}$ of transistor 402.

Thus, iSELECTION_BIAS is configured to bias transistor 420 such that Iselection is at or above Ihold. LWLSEL equal to V_LO is configured to limit Icell as a function of time (and thus, energy dissipation) during the selection current transient and to maintain Icell at or above Ihold after the transient, i.e., during steady state.

Figure 5:
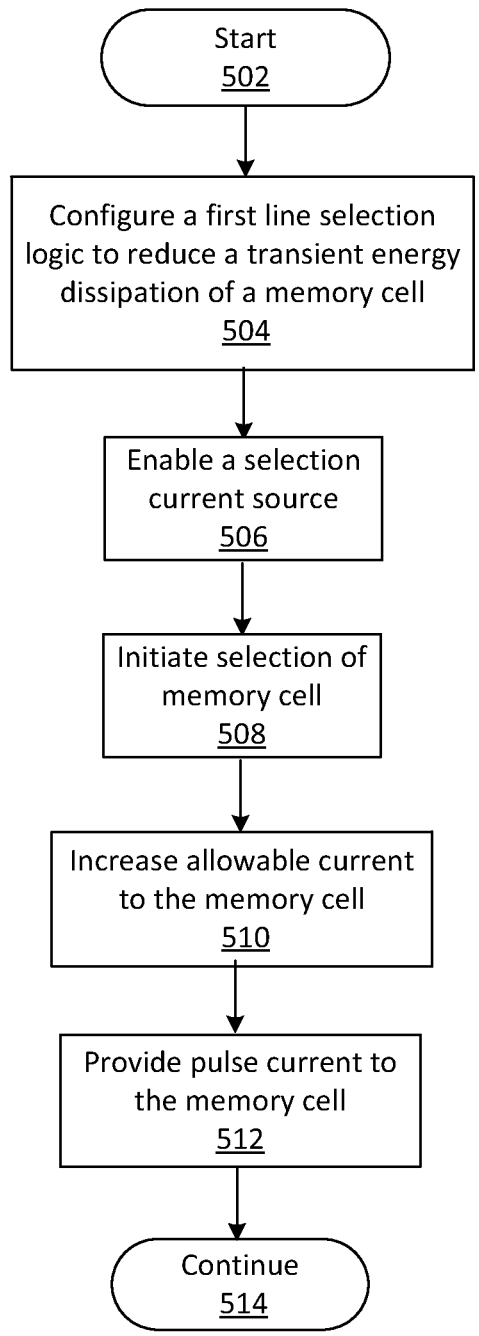
FIG. 5 illustrates a flowchart of operations for controlling current through a memory cell consistent with various embodiments of the present disclosure.

FIG. 5 illustrates a flowchart 500 of operations for controlling current through a memory cell consistent with various embodiments of the present disclosure. The operations may be performed, for example, by a memory controller, e.g., memory controller 104, including WL control module 114, BL control module 116, mitigation module 120 and/or mitigation module 124. Flowchart 500 depicts exemplary operations configured to control current through a memory cell during memory access operations. In particular, flowchart 500 depicts exemplary operations configured to limit transient current through the memory cell during selection, maintain current through the selected memory cell at or above a hold current and allow relatively higher current during read and/or write operations, as described herein.

Operations of flowchart 500 may begin with start at operation 502. A first line selection logic may be configured to reduce a transient energy dissipation of a memory cell at operation 504. For example, transient energy dissipation during memory cell selection may be reduced by adjusting a first line select control input to first line selection logic to configure the first line selection logic to increase the current path resistance and reduce a related voltage swing to reduce the transient energy dissipation during memory cell selection. The transient current as a function of time may thus be limited by adjusting the first line select control input to the first line selection logic. A selection current source may be enabled at operation 506. Selection of a memory cell may be initiated at operation 508. The allowable current to the memory cell may be increased at operation 510. For example, the first line select control input to the first line selection logic may be adjusted to configure the respective selection logic to decrease the current path resistance and increase allowable current. A pulse current may be provided to the memory cell at operation 512. A value of the pulse current is related to whether the associated memory access operation is a read or a write (i.e., programming) operation. Program flow may then continue at operation 514.

Thus, the operations of flowchart 500 are configured to control the current through a memory cell during a selection transient, during selection steady state and during memory access (e.g., read and/or programming).

While FIG. 5 illustrates various operations according one embodiment, it is to be understood that not all of the operations depicted in FIG. 5 are necessary for other embodiments. Indeed, it is fully contemplated herein that in other embodiments of the present disclosure, the operations depicted in FIG. 5 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "logic" and/or the term "module" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The logic and/or module may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

In some embodiments, a hardware description language may be used to specify circuit and/or logic implementation(s) for the various modules and/or circuitry described herein. For example, in one embodiment the hardware description language may comply or be compatible with a very high speed integrated circuits (VHSIC) hardware description language (VHDL) that may enable semiconductor fabrication of one or more circuits and/or modules described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

Thus, a system and method configured to control current through a selected memory cell in phase change memory. The system and method are configured to configure line selection logic to reduce transient energy dissipation during memory cell selection while maintaining a steady state current of the selected memory cell at or above a hold current for the memory cell. The method and system are configured to configure line selection logic to limit transient current as a function of time through the memory cell during selection and allow a relatively larger current during memory access operations, i.e., reading and/or writing. The system and method are configured to increase a resistance of the selected memory cell current path during the memory cell selection current transient and to reduce the resistance of the selected memory cell current path during reading and/or programming.

EXAMPLES

Examples of the present disclosure include subject material such as a method, means for performing acts of the method, a device, or of an apparatus or system related to controlling current through a memory cell, as discussed below.

Example 1

According to this example there is provided an apparatus. The apparatus includes a memory controller including a word line (WL) control module and a bit line (BL) control module. The memory controller is to initiate selection of a memory cell. The apparatus further includes a mitigation module to configure a first line selection logic to reduce a transient energy dissipation of the memory cell, the transient energy related to selecting the memory cell.

Example 2

This example includes the elements of example 1, wherein the mitigation module is further to enable a selection current source to provide a selection current, the selection current greater than or equal to a hold current associated with the memory cell.

Example 3

This example includes the elements of example 1, wherein the mitigation module is further to configure the first line selection logic to increase an allowable current to the memory cell and enable a pulse current source to provide a pulse current to the memory cell, the pulse current to at least one of read from and/or program the memory cell.

Example 4

This example includes the elements according to any one of examples 1 through 3, wherein the first line selection logic is to select a word line.

Example 5

This example includes the elements according to any one of examples 1 through 3, wherein the first line selection logic is to select a bit line.

Example 6

This example includes the elements of example 2, wherein the selection current source is a constant current source.

Example 7

This example includes the elements of example 3, wherein the mitigation module is to disable a selection current source when the pulse current source is enabled.

Example 8

This example includes the elements according to any one of examples 1 through 3, wherein reducing the transient energy dissipation includes reducing a change in voltage triggered by the memory cell selection.

Example 9

This example includes the elements according to any one of examples 1 through 3, wherein reducing the transient energy dissipation includes increasing a resistance of a selected memory cell current path.

Example 10

This example includes the elements of example 3, wherein increasing allowable current includes decreasing a resistance of a selected memory cell current path.

Example 11

This example includes the elements of example 2, wherein the hold current is to maintain the selected memory cell in a selected state.

Example 12

This example includes the elements according to any one of examples 1 through 3, wherein the first line selection logic includes a transistor.

Example 13

This example includes the elements according to any one of examples 1 through 3, wherein configuring the first line selection logic includes adjusting a first line select control input to the first line selection logic.

Example 14

This example includes the elements according to any one of examples 1 through 3, wherein the transient energy is related to a line path capacitance.

Example 15

This example includes the elements of example 2, wherein the selection current source is a current mirror.

Example 16

This example includes the elements of example 2, wherein the selection current source includes a transistor.

Example 17

This example includes the elements according to any one of examples 1 through 3, wherein the first line selection logic is to select a word line and further including a second line selection logic to select a bit line, the bit line included in a low impedance path.

Example 18

This example includes the elements according to any one of examples 1 through 3, wherein the first line selection logic is to select a bit line and further including a second line selection logic to select a word line, the word line included in a low impedance path.

Example 19

According to this example there is provided a method. This method includes initiating, by a memory controller, selection of a memory cell; and configuring, by a mitigation module, a first line selection logic to reduce a transient energy dissipation of the memory cell, the transient energy related to selecting the memory cell.

Example 20

This example includes the elements of example 19, and further includes enabling, by the mitigation module, a selection current source to provide a selection current, the selection current greater than or equal to a hold current associated with the memory cell.

Example 21

This example includes the elements of example 19, and further includes configuring, by the mitigation module, the first line selection logic to increase an allowable current to the memory cell; and enabling, by the mitigation module, a pulse current source to provide a pulse current to the memory cell, the pulse current to at least one of read from and/or program the memory cell.

Example 22

This example includes the elements of example 19, wherein the first line selection logic is to select a word line.

Example 23

This example includes the elements of example 19, wherein the first line selection logic is to select a bit line.

Example 24

This example includes the elements of example 20, wherein the selection current source is a constant current source.

Example 25

This example includes the elements of example 21, and further includes disabling, by the mitigation module, a selection current source when the pulse current source is enabled.

Example 26

This example includes the elements of example 19, wherein reducing the transient energy dissipation includes reducing a change in voltage triggered by the memory cell selection.

Example 27

This example includes the elements of example 19, wherein reducing the transient energy dissipation includes increasing a resistance of a selected memory cell current path.

Example 28

This example includes the elements of example 21, wherein increasing allowable current includes decreasing a resistance of a selected memory cell current path.

Example 29

This example includes the elements of example 20, wherein the hold current is to maintain the selected memory cell in a selected state.

Example 30

This example includes the elements of example 19, wherein the first line selection logic includes a transistor.

Example 31

This example includes the elements of example 19, wherein configuring the first line selection logic includes adjusting a first line select control input to the first line selection logic.

Example 32

This example includes the elements of example 19, wherein the transient energy is related to a line path capacitance.

Example 33

This example includes the elements of example 20, wherein the selection current source is a current minor.

Example 34

This example includes the elements of example 20, wherein the selection current source includes a transistor.

Example 35

This example includes the elements of example 19, wherein the first line selection logic is to select a word line and further including selecting, by a second line selection logic, a bit line, the bit line included in a low impedance path.

Example 36

This example includes the elements of example 19, wherein the first line selection logic is to select a bit line and further including selecting, by a second line selection logic, a word line, the word line included in a low impedance path.

Example 37

According to this example there is provided a system. The system includes a processor; a cross-point memory array and a memory controller. The cross-point memory array includes a memory cell, a word line (WL) and a bit line (BL). The memory cell is coupled between the word line and the bit line. The memory controller is to initiate selection of the target memory cell. The memory controller includes a WL control module and a BL control module, and a mitigation module. The mitigation module is to configure a first line selection logic to reduce a transient energy dissipation of the memory cell, the transient energy related to selecting the memory cell.

Example 38

This example includes the elements of example 37, wherein the mitigation module is further to enable a selection current source to provide a selection current, the selection current greater than or equal to a hold current associated with the memory cell.

Example 39

This example includes the elements of example 37, wherein the mitigation module is further to configure the first line selection logic to increase an allowable current to the memory cell and enable a pulse current source to provide a pulse current to the memory cell, the pulse current to at least one of read from and/or program the memory cell.

Example 40

This example includes the elements according to any one of examples 37 through 39, wherein the first line selection logic is to select a word line.

Example 41

This example includes the elements according to any one of examples 37 through 39, wherein the first line selection logic is to select a bit line.

Example 42

This example includes the elements of example 38, wherein the selection current source is a constant current source.

Example 43

This example includes the elements of example 39, wherein the mitigation module is to disable a selection current source when the pulse current source is enabled.

Example 44

This example includes the elements according to any one of examples 37 through 39, wherein reducing the transient energy dissipation includes reducing a change in voltage triggered by the memory cell selection.

Example 45

This example includes the elements according to any one of examples 37 through 39, wherein reducing the transient energy dissipation includes increasing a resistance of a selected memory cell current path.

Example 46

This example includes the elements of example 39, wherein increasing allowable current includes decreasing a resistance of a selected memory cell current path.

Example 47

This example includes the elements of example 38, wherein the hold current is to maintain the selected memory cell in a selected state.

Example 48

This example includes the elements according to any one of examples 37 through 39, wherein the first line selection logic includes a transistor.

Example 49

This example includes the elements according to any one of examples 37 through 39, wherein configuring the first line selection logic includes adjusting a first line select control input to the first line selection logic.

Example 50

This example includes the elements according to any one of examples 37 through 39, wherein the transient energy is related to a line path capacitance.

Example 51

This example includes the elements of example 38, wherein the selection current source is a current mirror.

Example 52

This example includes the elements of example 38, wherein the selection current source includes a transistor.

Example 53

This example includes the elements according to any one of examples 37 through 39, wherein the first line selection logic is to select a word line and further including a second line selection logic to select a bit line, the bit line included in a low impedance path.

Example 54

This example includes the elements according to any one of examples 37 through 39, wherein the first line selection logic is to select a bit line and further including a second line selection logic to select a word line, the word line included in a low impedance path.

Example 55

A system comprising at least one device arranged to perform the method of any one of examples 19 to 36.

Example 56

A device comprising means to perform the method of any one of examples 19 to 36.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
a memory controller comprising a word line (WL) control module and a bit line (BL) control module, the memory controller to initiate selection of a memory cell in a phase change memory; and
a mitigation module to configure a first line selection logic to reduce transient energy dissipation related to snap back occurring when selecting the memory cell by:
enabling a selection current source to provide a selection current greater than or equal to a hold current associated with the memory cell,
configuring the first line selection logic to increase an allowable current to the memory cell by decreasing a drain-source resistance for at least one MOSFET in a current path and enable a pulse current source to provide a pulse current to at least one of read from or program the memory cell, and
disabling the selection current source when the pulse current source is enabled.

2. The apparatus of claim 1, wherein the first line selection logic is to select a word line.

3. The apparatus of claim 1, wherein the first line selection logic is to select a bit line.

4. The apparatus of claim 1, wherein the selection current source is a constant current source.

5. The apparatus of claim 1 further comprising a line path capacitance associated with the first line selection logic and the selection current source.

6. The apparatus of claim 5 wherein initiating selection of a memory cell includes charging said line path capacitance to a charge and voltage related to a first bias voltage.

7. A method comprising:
initiating, by a memory controller, selection of a memory cell in a phase change memory; and
configuring, by a mitigation module, a first line selection logic to reduce a transient energy dissipation of the memory cell, the transient energy related to snap back occurring when selecting the memory cell; enabling, by the mitigation module, a selection current source to provide a selection current, the selection current greater than or equal to a hold current associated with the memory cell; configuring, by the mitigation module, the first line selection logic to increase an allowable current to the memory cell by decreasing a drain-source resistance for at least one MOSFET in a current path; enabling, by the mitigation module, a pulse current source to provide a pulse current to the memory cell, the pulse current to at least one of read from or program the memory cell; and disabling, by the mitigation module, a selection current source when the pulse current source is enabled.

8. The method of claim 7, wherein the first line selection logic is to select a word line.

9. The method of claim 7, wherein the first line selection logic is to select a bit line.

10. The method of claim 7, wherein the selection current source is a constant current source.

11. The method of claim 7 further comprising controlling a line path capacitance associated with the first line selection logic and the selection current source.

12. The method of claim 11 wherein initiating selection of a memory cell includes charging said line path capacitance to a charge and voltage related to a first bias voltage.

13. A system comprising:
a processor;
a cross-point memory array comprising a memory cell in a phase change memory, a word line (WL) and a bit line (BL), the memory cell coupled between the word line and the bit line; and
a memory controller to initiate selection of a target memory cell, the memory controller comprising:
a WL control module and a BL control module, and
a mitigation module to configure a first line selection logic to reduce transient energy dissipation related to snap back occurring when selecting the memory cell by enabling a selection current source to provide a selection current greater than or equal to a hold current associated with the memory cell, configuring the first line selection logic to increase an allowable current to the memory cell by decreasing a drain-source resistance for at least one MOSFET in a current path and enable a pulse current source to provide a pulse current to at least one of read from or program the memory cell, and disabling the selection current source when the pulse current source is enabled.

14. The system of claim 13, wherein the first line selection logic is to select a word line.

15. The system of claim 13, wherein the first line selection logic is to select a bit line.

16. The system of claim 13, wherein the selection current source is a constant current source.

17. The system of claim 13 further comprising controlling a line path capacitance associated with the first line selection logic and the selection current source.

18. The system of claim 17 wherein initiating selection of a memory cell includes charging said line path capacitance to a charge and voltage related to a first bias voltage.

* * * * *